United States Patent
Ke (10) Patent No.: US 11,196,014 B2
(45) Date of Patent: Dec. 7, 2021

(54) FLEXIBLE DISPLAY PANEL AND MANUFACTURING METHOD THEREOF

(71) Applicant: Wuhan China Star Optoelectronics Semiconductor Display Technology Co., Ltd., Wuhan (CN)

(72) Inventor: Linbo Ke, Wuhan (CN)

(73) Assignee: Wuhan China Star Optoelectronics Semiconductor Display Technology Co., Ltd., Wuhan (CN)

(*) Notice: Subject to any disclaimer, the term of this patent is extended or adjusted under 35 U.S.C. 154(b) by 150 days.

(21) Appl. No.: 16/625,807

(22) PCT Filed: Nov. 6, 2019

(86) PCT No.: PCT/CN2019/115907
§ 371 (c)(1),
(2) Date: Dec. 23, 2019

(87) PCT Pub. No.: WO2021/027102
PCT Pub. Date: Feb. 18, 2021

(65) Prior Publication Data
US 2021/0288276 A1  Sep. 16, 2021

(30) Foreign Application Priority Data
Aug. 13, 2019 (CN) .......................... 201910745902.0

(51) Int. Cl.
*H01L 51/00* (2006.01)
*H01L 51/56* (2006.01)
*H01L 27/32* (2006.01)

(52) U.S. Cl.
CPC .......... *H01L 51/0097* (2013.01); *H01L 51/56* (2013.01); *H01L 27/3244* (2013.01); *H01L 2227/323* (2013.01); *H01L 2227/326* (2013.01); *H01L 2251/303* (2013.01); *H01L 2251/5338* (2013.01)

(58) Field of Classification Search
None
See application file for complete search history.

(56) References Cited

U.S. PATENT DOCUMENTS

2016/0181338 A1* 6/2016 Heo .................... H01L 51/0097
257/40
2018/0053905 A1* 2/2018 Lee ..................... H01L 27/3276
2020/0052237 A1 2/2020 Wang et al.
(Continued)

FOREIGN PATENT DOCUMENTS

| CN | 108054292 | 5/2018 |
| CN | 108257982 | 7/2018 |
| CN | 109065758 | 12/2018 |

(Continued)

*Primary Examiner* — J. E. Schoenholtz (57) ABSTRACT

The disclosure provides a flexible display panel and a manufacturing method thereof. The flexible display panel includes a display region, a bending region, a flexible substrate, a driver circuit layer, and a luminescent functional layer. The flexible substrate includes a first flexible layer, a first barrier layer, and a second flexible layer. The first barrier layer includes a metal oxide disposed in the display region and a stacked-layer including a metal and the metal oxide disposed in the bending region. The disclosure improves flexibility of flexible substrates.

19 Claims, 6 Drawing Sheets

(56) References Cited

U.S. PATENT DOCUMENTS

2020/0161572 A1* 5/2020 Zheng ................ H01L 27/3246
2020/0201392 A1* 6/2020 Yu ...................... H01L 27/3276

FOREIGN PATENT DOCUMENTS

| CN | 109461830 | 3/2019 |
| CN | 109524563 | 3/2019 |
| CN | 110071230 | 7/2019 |

\* cited by examiner

FLEXIBLE DISPLAY PANEL AND MANUFACTURING METHOD THEREOF

RELATED APPLICATIONS

This application is a National Phase of PCT Patent Application No. PCT/CN2019/115907 having International filing date of Nov. 6, 2019, which claims the benefit of priority of Chinese Patent Application No. 201910745902.0 filed on Aug. 13, 2019. The contents of the above applications are all incorporated by reference as if fully set forth herein in their entirety.

FIELD AND BACKGROUND OF THE INVENTION

The present disclosure relates to the field of display technology and, more particularly, relates to a flexible display panel and a manufacturing method thereof.

Currently, the most promising material used to manufacture flexible substrates is polyimide (PI). Since PI has a weak ability to block moisture and oxygen, non-organic thin films with single or multiple stacked-layers having even thicknesses or alternatively stacked-layers including PI and a non-organic thin film are usually deposited on a surface of the PI to block moisture and oxygen. However, stresses on the non-organic thin films are too concentrated, and the non-organic thin films are prone to breakage when bent, which reduces flexibility of flexible display panels.

Consequently, it is necessary to improve the technical problem that non-organic thin films of conventional flexible display panels reduce flexibility of a flexible substrate.

SUMMARY OF THE INVENTION

The present disclosure provides a flexible display panel and a method of manufacturing same to alleviate the technical problem that non-organic thin films of conventional flexible display panels reduce flexibility of a flexible substrate.

To solve the above problem, technical solutions provided by the present disclosure are described as follows:

The present disclosure provides a flexible display panel, including: a display region and a bending region. The flexible display panel further includes a flexible substrate, a driver circuit layer disposed on a side of the flexible substrate, and a luminescent functional layer disposed on a side of the driver circuit layer away from the flexible substrate. The flexible substrate includes a first flexible layer, a first barrier layer, and a second flexible layer. The first barrier layer includes a first metal oxide disposed in the display region and a stacked-layer including a first metal and the first metal oxide disposed in the bending region.

In the flexible display panel of the present disclosure, material of the first metal is Al.

In the flexible display panel of the present disclosure, in the bending region, an area of the first metal oxide is equal to an area the bending region.

In the flexible display panel of the present disclosure, a plurality of rows of the first metal oxides are arranged along a first direction in the bending region.

In the flexible display panel of the present disclosure, a plurality of arrays of the first metal oxides are distributed in the bending region.

In the flexible display panel of the present disclosure, in the bending region, a thickness of the first metal oxide is less than one quarter of a thickness the first barrier layer.

In the flexible display panel of the present disclosure, the flexible substrate further includes a second barrier layer formed on a side of the second flexible layer away from the first barrier layer, and the second barrier layer includes a stacked-layer including a second metal and a second metal oxide.

In the flexible display panel of the present disclosure, the second metal oxide is formed in at least one of the bending region or the display region.

In the flexible display panel of the present disclosure, a thickness of the second metal oxide is equal to a thickness the first metal oxide disposed in the bending region.

The present disclosure further provides a method of manufacturing a flexible display panel, including the following steps: providing a substrate; forming a flexible substrate on a side of the substrate, wherein the flexible substrate includes a first flexible layer, a first barrier layer, and a second flexible layer, and the first barrier layer includes a first metal oxide disposed in a display region and a stacked-layer including a first metal and the first metal oxide disposed in a bending region; forming a driver circuit layer and a luminescent functional layer on a side of the flexible substrate away from the substrate; and peeling off the substrate.

In the method of the present disclosure, the step of forming a flexible substrate on a side of the substrate, wherein the flexible substrate includes a first flexible layer, a first barrier layer, and a second flexible layer, and the first barrier layer includes a first metal oxide disposed in a display region and a stacked-layer including a first metal and the first metal oxide disposed in a bending region, including the following steps: depositing the first metal on the first flexible layer, wherein the first metal is disposed in the display region and the bending region; and patterning the first metal by oxidation process to oxidize the first metal to form the first metal oxide in the display region, and then oxidizing the first metal in the bending region to form the stacked-layer including the first metal and the first metal oxide, wherein the stacked-layer is the first barrier layer.

In the method of the present disclosure, the step of depositing the first metal on the first flexible layer, wherein the first metal is disposed in the display region and the bending region, including the following step: forming the first metal by physical vapor deposition.

In the method of the present disclosure, the step of depositing the first metal on the first flexible layer, wherein the first metal is disposed in the display region and the bending region, including the following step: depositing Al on the first flexible layer.

In the method of the present disclosure, the step of patterning the first metal by oxidation process to oxidize the first metal to form the first metal oxide in the display region, and then oxidizing the first metal in the bending region to form the stacked-layer including the first metal and the first metal oxide, wherein the stacked-layer is the first barrier layer, including the following step: patterning the first metal by oxidation process, and then forming the first metal oxide in the bending region, wherein an area of the first metal oxide in the bending region is equal to an area the bending region.

In the method of the present disclosure, the step of patterning the first metal by oxidation process to oxidize the first metal to form the first metal oxide in the display region, and then oxidizing the first metal in the bending region to form the stacked-layer including the first metal and the first metal oxide, wherein the stacked-layer is the first barrier layer, including the following step: patterning the first metal by oxidation process to form a plurality of rows of the first metal oxides arranged along a first direction in the bending region.

In the method of the present disclosure, the step of patterning the first metal by oxidation process to oxidize the first metal to form the first metal oxide in the display region, and then oxidizing the first metal in the bending region to form a stacked-layer including the first metal and the first metal oxide, wherein the stacked-layer is the first barrier layer, including the following step: patterning the first metal by oxidation process to form a plurality of arrays of the first metal oxides distributed in the bending region.

In the method of the present disclosure, the method of patterning the first metal by oxidation process to oxidize the first metal to form the first metal oxide in the display region, and then oxidizing the first metal in the bending region to form the stacked-layer including the first metal and the first metal oxide, wherein the stacked-layer is the first barrier layer, including the following step: patterning the first metal by oxidation process to make a thickness of the first metal oxide formed in the bending region less than one quarter of a thickness of the first barrier layer.

In the method of the present disclosure, a step after forming the flexible substrate on the side of the substrate, wherein the flexible substrate includes the first flexible layer, the first barrier layer, and the second flexible layer, and the first barrier layer includes the first metal oxide disposed in the display region and the stacked-layer including the first metal and the first metal oxide disposed in a bending region, further including the following step: forming a second barrier layer on the second flexible layer, wherein the second barrier layer includes a stacked-layer including a second metal and a second metal oxide.

In the method of the present disclosure, the step of forming the second barrier layer on the second flexible layer, wherein the second barrier layer includes the stacked-layer including the second metal and the second metal oxide, including the following step: oxidizing the second metal in at least one of the bending region or the display region to form the stacked-layer including the second metal and the second metal oxide.

In the method of the present disclosure, the step of forming the second barrier layer on the second flexible layer, wherein the second barrier layer includes the stacked-layer including the second metal and the second metal oxide, including the following step: forming the second metal oxide by natural oxidation or thermal oxidation.

Regarding the beneficial effects: The present disclosure provides a flexible display panel and a method of manufacturing same. The flexible display panel includes a display region and a bending region. The flexible display panel further includes a flexible substrate, a driver circuit layer disposed on a side of the flexible substrate, and a luminescent functional layer disposed on a side of the driver circuit layer away from the flexible substrate. The flexible substrate includes a first flexible layer, a first barrier layer, and a second flexible layer. The first barrier layer includes a first metal oxide disposed in the display region and a stacked-layer including a first metal and the first metal oxide disposed in the bending region. The entire metal in the display region is oxidized to form the metal display oxides and a portion of metal in the bend region are oxidized to form the metal display oxide. In the display region, the metal oxide can block moisture and oxygen. In the bending region, the metal can improve flexibility of the display panel, and the metal oxide can improve adhesion of the second flexible layer, thereby improving stability in a bending state. The metal oxide in the display region and the metal oxide in the bending region can make the flexible display panel have a great ability to block moisture and oxygen and good flexibility, which solves the technical problem that non-organic thin films of conventional flexible display panels reduce flexibility of a flexible substrate.

BRIEF DESCRIPTION OF THE SEVERAL VIEWS OF THE DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which those skilled in the art can derive further figures without making any inventive efforts.

DESCRIPTION OF SPECIFIC EMBODIMENTS OF THE INVENTION

The following description of the various embodiments is provided with reference to the accompanying drawings. It should be understood that terms such as "upper", "lower", "front", "rear", "left", "right", "inside", "outside", "lateral", as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure. In the drawings, the identical or similar reference numerals constantly denote the identical or similar elements or elements having the identical or similar functions.

The present disclosure provides a flexible display panel and a manufacturing method thereof to alleviate the technical problem that non-organic thin films of conventional flexible display panels reduce flexibility of a flexible substrate.

Figure 1:
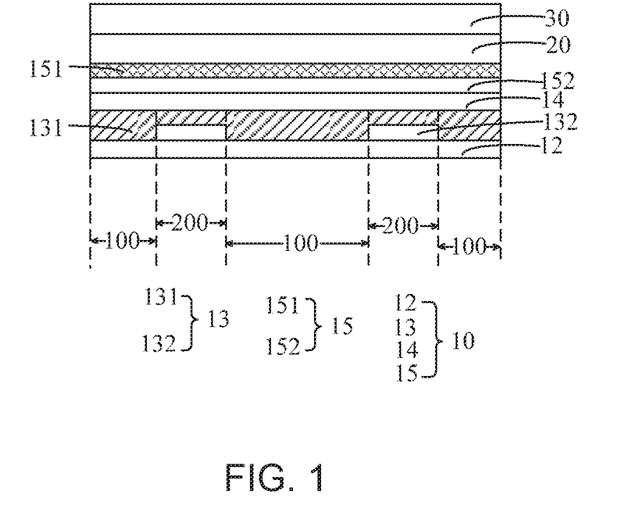
FIG. 1 is a first schematic structural view showing a flexible display panel provided by an embodiment of the present disclosure.

As shown in FIG. 1, the present disclosure provides a flexible display panel, including a display region 100 and a bending region 200. The flexible display panel further includes a flexible substrate 10, a driver circuit layer 20, and a luminescent functional layer 30.

The flexible substrate 10 includes a first flexible layer 12, a first barrier layer 13, and a second flexible layer 14. The first barrier layer 13 includes a first metal oxide 131 disposed in the display region 100 and a stacked-layer including a first metal 132 and the first metal oxide 131 disposed in the bending region 200.

The driver circuit layer 20 is formed on a side of the flexible substrate 10.

The luminescent functional layer 30 is formed on a side of the flexible substrate 10 away from the driver circuit layer 20.

In the present embodiment, the first flexible layer 12 and the second flexible layer 14 may be polyimide or flexible glass.

Material of the first metal 132 is Al, and material of the first metal oxide 131 is aluminum oxide. The first metal 132 is formed on the first flexible layer 12 by physical vapor deposition.

In the display region 100, the first barrier layer 13 includes the first metal oxide 131, that is, Al is fully oxidized to form aluminum oxide. Area of the first metal oxide 131 is equal to that of the display region 100, and a thickness of the first metal oxide 131 is equal to that of the first barrier layer 13. Therefore, the first metal oxide 131, which is a dense aluminum oxide layer, can be formed, and the aluminum oxide has a good ability to block moisture and oxygen.

In the bending region 200, the first barrier layer 13 includes the stacked-layer including the first metal 132 and the first metal oxide 131, that is, only a side of the Al away from the first flexible layer 12 is oxidized to form the aluminum oxide, and a thickness of the first metal 131 is less than that of the first barrier layer 13.

In one embodiment, in the first barrier layer 13 in the bending region 200, the thickness of the first metal oxide 131 is less than one quarter of that of the first barrier layer 13. Only a thin layer of first metal oxide 131 is formed on the first barrier layer 13 in the bending region 200, and most components of the first barrier layer 13 in the bending region 200 is the first metal 132. The first metal 132 has exceptional extensibility and can improve flexibility of a flexible display panel.

The second flexible layer 14 is formed on the first barrier layer 13 and contacts the first metal 131. In the bending region 200, the first metal oxide 131 has a better surface roughness and directly contacts the second flexible layer 14. The first metal oxide 131 can improve adhesion between the Al and the second flexible layer 14. Therefore, a display panel has exceptional stability in high temperature and high humidity environment or in bending state, which can prevent increase of internal stress and breakage of non-organic thin films when the display panel is bent.

The driver circuit layer 20 includes a driver circuit. The luminescent functional layer 30 is formed on the driver circuit layer 20, and the driver circuit drives the luminescent functional layer 30 to emit light.

In the bending region 200, a shape of the first metal oxide 131 can vary. In the present embodiment, in the bending region 200, an area of the first metal oxide 131 is equal to that of the bending region 200.

The first barrier layer 13 can be manufactured by the following steps: manufacturing the first metal 132, blocking the bending region 200, thermally oxidizing the first metal 132 in the display region 100 to make the entire first metal 132 transform into the first metal oxide 131, and naturally oxidizing or thermally oxidizing the first metal 132 in the bending region 200 to form a thin layer of first metal oxide 131 on a surface of the first metal 132; after that, some amount of the Al, which is a remaining first metal 132, remains unoxidized in the first barrier layer 13 in the bending region 200.

In conventional technology, a substrate of flexible display panels is usually made of polyimide (PI) due to its heat resistance, radiation resistance, chemical resistance, electrical insulation, and mechanical behavior. However, the PI has a poor ability to block moisture and oxygen. To improve moisture and oxygen blocking ability of the substrate, non-organic thin films with single or multiple stacked-layers having even thicknesses or alternatively stacked-layers including PI and a non-organic thin film are usually deposited on a surface of the PI. However, the non-organic thin films of the above structures have problems such as stress concentration, easy breakage in the bending region, and easy separation in high temperature and high humidity environment.

In the present disclosure, a structure of a flexible layer with a metal barrier layer is substituted for the non-organic thin films. Al has exceptional extensibility and is hard to react with moisture and oxygen in high temperature environment. Moreover, Al has great thermal conductivity, and aluminum oxide has good chemical stability and an excellent ability to block moisture and oxygen.

In the present disclosure, Al in the display region 100 is fully oxidized to a dense aluminum oxide layer. Aluminum oxide has good chemical stability and an excellent ability to block moisture and oxygen. Al in the bending region 200 is partially oxidized to a thin aluminum oxide layer. Compared to non-organic layers of the conventional technology, an unoxidized Al has better extensibility, which can provide flexibility for a flexible display panel. Compared to deposited non-organic layers of the conventional technology, the thin-film aluminum oxide layer has better surface roughness, which can improve adhesion between the Al and the second flexible layer 14. In the bending region 200, a stacked-layer including the first metal 132 and the first metal oxide 131 makes the flexible display panel have exceptional stability in high temperature and high humidity environment or in bending state.

Figure 2:
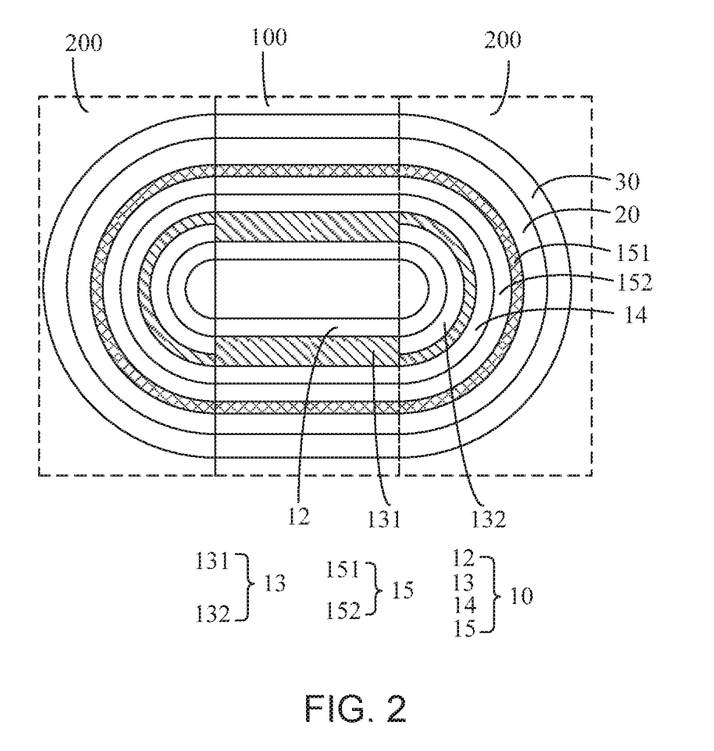
FIG. 2 is a schematic view showing a curved structure of a flexible display panel provided by an embodiment of the present disclosure.

In the present disclosure, Al with a certain thickness is deposited on a surface of PI, the Al in the display region 100 is fully oxidized to a dense aluminum oxide layer, and only a portion of the Al in the bending region 200 is oxidized to a thin aluminum oxide layer, thereby forming PI/aluminum oxide composite films on a substrate. Therefore, exceptional properties of PI can be retained, while moisture and oxygen blocking ability can be improved by the dense first metal oxide 131, and flexibility can be improved by the first metal 132 and the thin first metal oxide 131. As a result, problems such as stress concentration, easy breakage in the bending region, and easy separation in high temperature and high humidity environment which are caused by the PI/aluminum oxide composite films can be prevented. By the above structure of the present disclosure, flexibility of the flexible display panel is improved, which is beneficial to form a foldable and flexible display panel with double curved surfaces as shown in FIG. 2.

In one embodiment, the flexible substrate 10 further includes a second barrier layer 15, and the second barrier layer 15 includes a stacked-layer including a second metal 152 and a second metal oxide 151. The first metal 132 is also Al, and the second metal oxide 151 is also aluminum oxide.

In one embodiment, a thickness of the second metal oxide 151 is equal to that of the first metal oxide 131 in the bending region 200. Since the metal oxide 131 of the first barrier layer 13 has improved an ability to block moisture and oxygen and flexibility, the second barrier layer 15 only needs to be surface-oxidized to form a thin second metal oxide 151. Therefore, an ability to block moisture and oxygen can be retained, and process optimization can be realized. The second metal oxide 151 can be formed in at least one of the bending region 200 or the display region 100, that is, the second metal oxide 151 can be formed only in the display region 100, only in the bending region 200, or in both the display region 100 and the bending region 200. In the present embodiment, the second metal oxide 151 is formed in both the display region 100 and the bending region 200, that is, the second metal oxide 151 is formed to be a layer and can be formed by natural oxidation or thermal oxidation.

In the first barrier layer 13, the first metal oxide 131 in the bending region 200 is used to improve adhesion between the first metal 132 and the second flexible layer 14. Therefore, in addition to a setting way that the first metal oxide 131 is formed in the entire bending region 200 shown in FIG. 1, the first metal oxide 131 can be formed in the bending region 200 by other setting ways.

Figure 3:
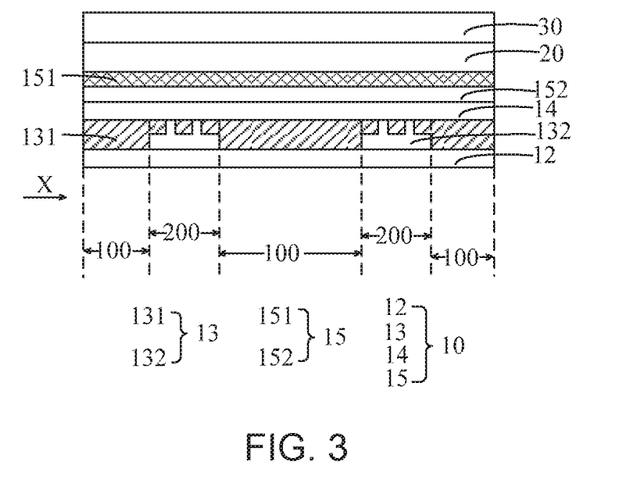
FIG. 3 is a second schematic structural view showing a flexible display panel provided by an embodiment of the present disclosure.

In one embodiment, as shown in FIG. 3, a plurality of rows of the first metal oxides 131 are arranged along a first direction X in the bending region 200. That is, not an entire surface of a side of Al away from the first flexible layer 12, but a portion of the surface of the side of the Al away from the first flexible layer 12 is oxidized to aluminum oxide. The aluminum oxide has a strip structure in the bending region 200. A plurality of rows of the aluminum oxides are arranged along the first direction X that the display region 100 points toward another display region 100 adjacent thereto when the flexible display panel is not bent.

A gap exists between adjacent first metal oxides 131. In one embodiment, the plurality of first metal oxides 131 are disposed at a same distance from each other.

The plurality of first metal oxides 131 may be disposed at different distances from each other. The plurality of first metal oxides 131 may be denser in a middle portion of the bending region 200 but sparser in a periphery of the bending region 200. Because the middle portion of the bending region 200 endures larger stresses when the flexible display panel with double curved surfaces is formed, as many of the first metal oxides 131 as possible are disposed in the middle portion of the bending region 200. Therefore, adhesion between the first metal 132 and the second flexible layer 14 can be improved, and flexibility of the flexible display panel can be further improved.

In one embodiment, a plurality of arrays of the first metal oxides 131 are distributed in the bending region 200, that is, in the bending region 200, not an entire surface of a side of Al away from the first flexible layer 12, but a portion of the surface of the side of the Al away from the first flexible layer 12 is oxidized to aluminum oxide. The aluminum oxide has a block structure in the bending region 200. The first metal oxides 131 which have the block structure form an array distribution in the bending region 200. The metal oxides 131 may be disposed at a same distance from each other or may be disposed at different differences from each other.

It should be noted that the setting way of the plurality of first metal oxides 131 in the bending region 200 is not limited hereto, and there are other setting ways; for example, the plurality of first metal oxides 131 may form a grid in the bending region 200. Those skilled in the art may design structures of the plurality of first metal oxides 131 according to their needs, as long as the structures have functions of improving adhesion between the first metal 132 and the second flexible layer 14, reducing internal stresses when the flexible display panel is bent, and improving flexibility of the flexible display panel.

Figure 4:
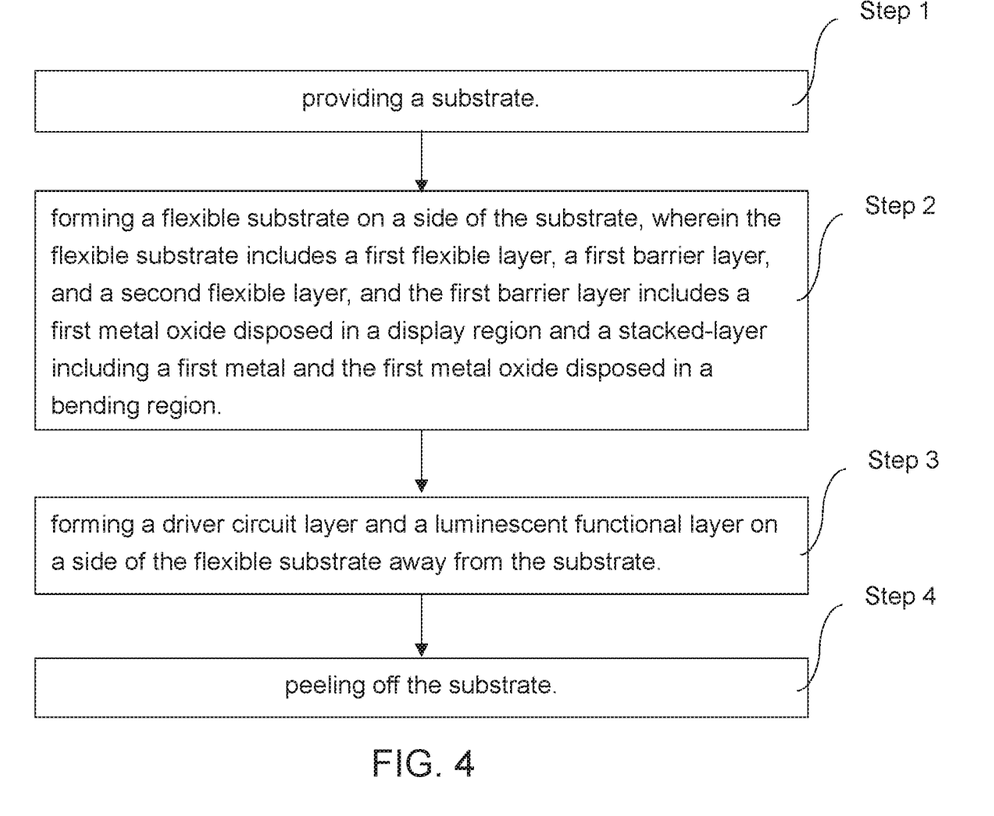
FIG. 4 is a schematic flowchart showing a method of manufacturing a flexible display panel provided by an embodiment of the present disclosure.

As shown in FIG. 4, the present disclosure further provides a method of manufacturing a flexible display panel, including the following steps:

Step 1: providing a substrate.

Step 2: forming a flexible substrate on a side of the substrate, wherein the flexible substrate includes a first flexible layer, a first barrier layer, and a second flexible layer, and the first barrier layer includes a first metal oxide disposed in a display region and a stacked-layer including a first metal and the first metal oxide disposed in a bending region.

Step 3: forming a driver circuit layer and a luminescent functional layer on a side of the flexible substrate away from the substrate.

Step 4: peeling off the substrate.

The method is described below in conjunction with FIGS. 1 to 13.

Figure 5:
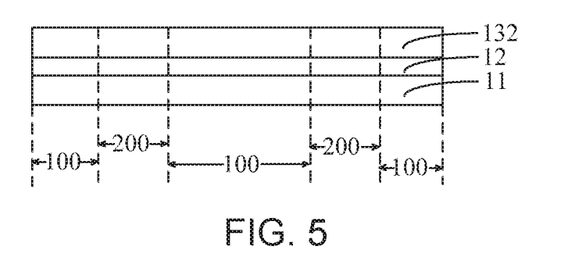
FIG. 5 is a schematic view showing a first step of a method of manufacturing a flexible display panel provided by an embodiment of the present disclosure.

Step 1: providing a substrate 11. As shown in FIG. 5, the substrate 11 is a rigid substrate which is usually glass. Because a flexible substrate of the flexible display panel cannot be used directly, it needs to be disposed on the rigid substrate 11 in advance.

Step 2: forming a flexible substrate 10 on a side of the substrate 11, wherein the flexible substrate 10 includes a first flexible layer 12, a first barrier layer 13, and a second flexible layer 14, and the first barrier layer 13 includes a first metal oxide 131 disposed in a display region 100 and a stacked-layer including a first metal 132 and the first metal oxide 131 disposed in a bending region 200.

As shown in FIG. 5, firstly, forming the first flexible layer 12 on the substrate 11. The first flexible layer may be PI or flexible glass and is formed on the substrate 11 by coating. In the present embodiment, the first flexible layer 12 is PI.

After that, forming the first barrier layer 13 on the first flexible layer 12.

Before the first barrier layer 13 is formed, an Al layer is formed on the first flexible layer 12 by physical vapor deposition or other ways to form the first metal 132. As shown in FIG. 5, the first metal 132 is disposed in the display region 100 and the bending region 200.

Then, patterning the first metal 132 by oxidation process to oxidize the first metal 132 to form the first metal oxide 131 in the display region 100, and then oxidizing the first metal 132 in the bending region 200 to form the stacked-layer including the first metal 132 and the first metal oxide 131, wherein the stacked-layer is the first barrier layer 13.

Figure 6:
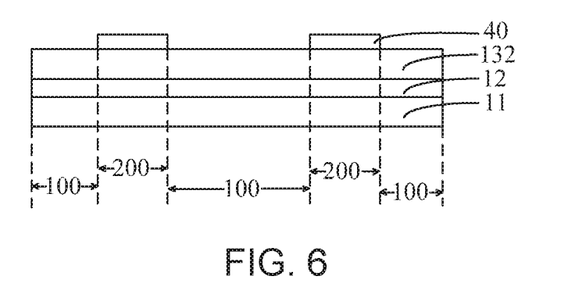
FIG. 6 is a schematic view showing a second step of a method of manufacturing a flexible display panel provided by an embodiment of the present disclosure.
Figure 7:
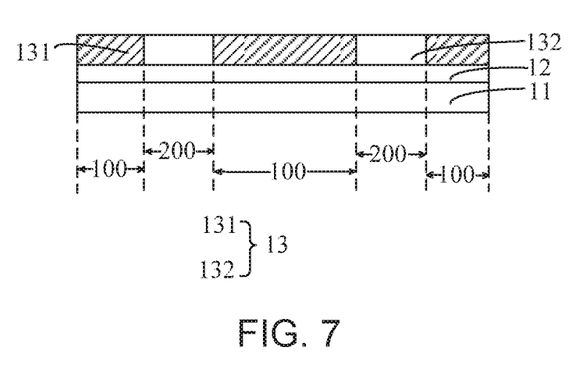
FIG. 7 is a schematic view showing a third step of a method of manufacturing a flexible display panel provided by an embodiment of the present disclosure.

As shown in FIG. 6, before an oxidation process, blocking the bending region 200 by a blocking component 40, and then thermal oxidizing the first metal 132 in the display region 100 until the entire first metal 132 in the bending region 100 is oxidized to the first metal oxide 131, which is shown in FIG. 7.

Figure 8:
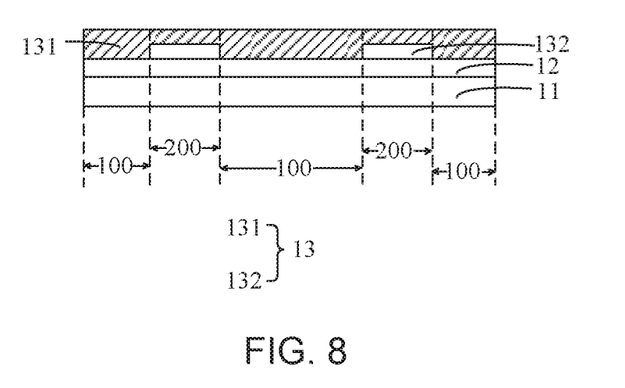
FIG. 8 is a schematic view showing a fourth step of a method of manufacturing a flexible display panel provided by an embodiment of the present disclosure.

Then, naturally oxidizing or thermally oxidizing the first metal 132 in the bending region 200 to form a thin first metal oxide 131 on a surface of the first metal 132. After that, some amount of the Al, which is a remaining first metal 132, remains unoxidized in the first barrier layer 13 in the bending region 200. By the above steps, the first barrier 13 is formed, and a structure of the first barrier 13 is shown in FIG. 8.

In the bending region 200, the first barrier layer 13 includes the stacked-layer including the first metal 132 and the first metal oxide 131, that is, only a side of the Al away from the first flexible layer 12 is oxidized to the aluminum oxide, and a thickness of the first metal oxide 131 is less than that of the first barrier layer 13.

In one embodiment, in the first barrier layer 13 in the bending region 200, the thickness of the first metal oxide 131 is less than one quarter of that of the first barrier layer 13. Only a thin layer of first metal oxide 131 is formed in the first barrier layer 13 in the bending region 200, and most components of the first barrier layer 13 in bending region 200 is the first metal 132. The first metal 132 has exceptional extensibility and can improve flexibility of a flexible display panel.

In the bending region 200, a shape of the first metal oxide 131 can vary. In the present embodiment, in the bending region 200, an area of the first metal oxide 131 is equal to that of the bending region 200.

Figure 9:
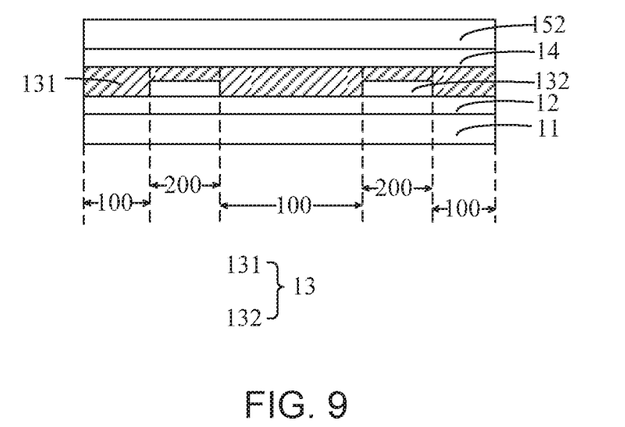
FIG. 9 is a schematic view showing a fifth step of a method of manufacturing a flexible display panel provided by an embodiment of the present disclosure.

Then, as shown in FIG. 9, forming the second flexible layer 14 on the first barrier layer 13, and material of the second flexible layer 14 is also PI.

The second flexible layer 14 is formed on the first barrier layer 13 and contacts the first metal 131. In the bending region 200, the first metal oxide 131 has a better surface roughness and directly contacts the second flexible layer 14. The first metal oxide 131 can improve adhesion between the Al and the second flexible layer 14 compared to a situation in which the Al directly contacts to the second flexible layer 14. Therefore, a display panel has exceptional stability in high temperature and high humidity environment or in bending state, which can prevent increase of internal stress and breakage of non-organic thin films when the display panel is bent.

In conventional technology, a substrate of flexible display panels is usually made of PI due to its heat resistance, radiation resistance, chemical resistance, electrical insulation, and mechanical behavior. However, the PI has a poor ability to block moisture and oxygen. To improve a moisture and oxygen blocking ability of the substrate, non-organic thin films with single or multiple stacked-layers having even thicknesses or alternatively stacked-layers including PI and a non-organic thin film are usually deposited on a surface of the PI. However, the non-organic thin films of the above structures have problems such as stress concentration, easy breakage in the bending region, and easy separation in high temperature and high humidity environment.

In the present disclosure, a structure of a flexible layer with a metal barrier layer is substituted for the non-organic thin films. Al has exceptional extensibility and is hard to react with moisture and oxygen in high temperature environment. Moreover, Al has great thermal conductivity, and aluminum oxide has good chemical stability and an excellent ability to block moisture and oxygen.

In the present disclosure, Al in the display region 100 is fully oxidized to a dense aluminum oxide layer. Aluminum oxide has good chemical stability and an excellent ability to block moisture and oxygen. Al in the bending region 200 is partially oxidized to a thin aluminum oxide layer. Compared to non-organic layers of the conventional technology, an unoxidized Al has better extensibility, which can provide flexibility for a flexible display panel. Compared to deposited non-organic layers of the conventional technology, the thin-film aluminum oxide layer has better surface roughness, which can improve adhesion between the Al and the second flexible layer 14. In the bending region 200, a stacked-layer including the first metal 132 and the first metal oxide 131 make the flexible display panel have exceptional stability in high temperature and high humidity environment or in bending state.

In the first barrier layer 13, the first metal oxide 131 in the bending region 200 is used to improve adhesion between the first metal 132 and the second flexible layer 14. In addition to a setting way that the first metal oxide 131 is formed in the entire bending region 200 shown in FIG. 1, the first metal oxide 131 can also be formed in the bending region 200 by other setting ways.

In one embodiment, as shown in FIG. 3, a plurality of rows of the first metal oxides 131 are arranged along a first direction X in the bending region 200. That is, not an entire surface of a side of Al away from the first flexible layer 12, but a portion surface of the side of the Al away from the first flexible layer 12 is oxidized to aluminum oxide. The aluminum oxide has a strip structure in the bending region 200. A plurality of rows of the aluminum oxides are arranged along the first direction X that the display region 100 points toward another display region 100 adjacent thereto when the flexible display panel is not bent.

A gap exists between adjacent first metal oxides 131. In one embodiment, the plurality of first metal oxides 131 are disposed at a same distance from each other.

The plurality of first metal oxides 131 may also be disposed at different distances from each other. The plurality of first metal oxides 131 may be denser in a middle portion of the bending region 200 but sparser in a periphery of the bending region 200. Because the middle portion of the bending region 200 endures larger stresses when the flexible display panel with double curved surfaces is formed, as many of the first metal oxides 131 as possible are disposed in the middle portion of the bending region 200. Therefore, adhesion between the first metal 132 and the second flexible layer 14 can be improved, and flexibility of the flexible display panel can be further improved.

In one embodiment, a plurality of arrays of the first metal oxides 131 are distributed in the bending region 200, that is, in the bending region 200, not an entire surface of a side of Al away from the first flexible layer 12, but a portion of the surface of the side of the Al away from the first flexible layer 12 is oxidized to aluminum oxide. The aluminum oxide has a block structure in the bending region 200. The first metal oxides 131, which have the block structure, form an array distribution in the bending region 200. The metal oxides 131 may be disposed at a same distance from each other or may be disposed at different differences from each other.

It should be noted that the setting way of the plurality of first metal oxides 131 in the bending region 200 is not limited hereto, and there are other setting ways; for example, the plurality of first metal oxides 131 may form a grid in the bending region 200. Those skilled in the art may design structures of the plurality of first metal oxides 131 according to their needs, as long as the structures have functions of improving adhesion between the first metal 132 and the second flexible layer 14, reducing internal stresses when the flexible display panel is bent, and improving flexibility of the flexible display panel.

In one embodiment, after the second flexible layer 14 is formed, a second barrier layer 15, which is a stacked-layer including a second metal 152 and a second metal oxide 151, is formed.

As shown in FIG. 9, firstly, forming the second metal 152 on the second flexible layer 14. The second metal 152 is also Al and is formed on the entire second flexible layer 14, that is, the second metal 152 is formed in both the display region 100 and the bending region 200.

Figure 10:
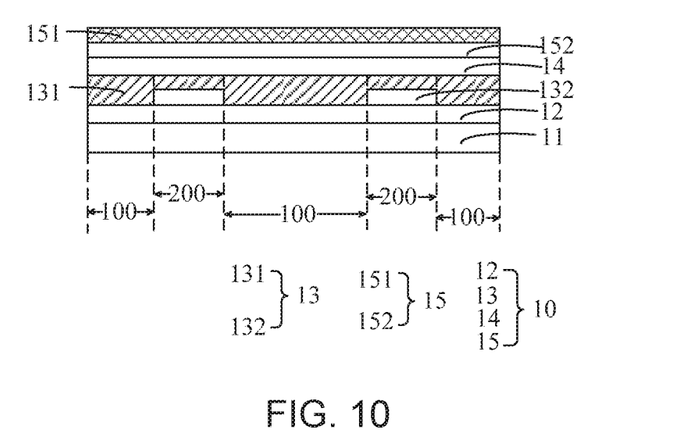
FIG. 10 is a schematic view showing a sixth step of a method of manufacturing a flexible display panel provided by an embodiment of the present disclosure.

Then, as shown in FIG. 10, naturally oxidizing or thermally oxidizing the entire second metal 152. Fully oxidizing a side of a surface of the second metal 152 away from the second flexible layer 14 to form the second metal oxide 151, which is aluminum oxide.

In one embodiment, a thickness of the second metal oxide 151 is equal to that of the first metal oxide 131 in the bending region 200. Since the metal oxide 131 of the first barrier layer 13 has improved an ability to block moisture and oxygen and flexibility, the second barrier layer 15 only needs to be surface-oxidized to form a thin layer of second metal oxide 151. Therefore, an ability to block moisture and oxygen can be retained, and process optimization can be realized.

The second metal oxide 151 can be formed in at least one of the bending region 200 or the display region 100, that is, the second metal oxide 15 can be formed only in the display region 100, only in the bending region 200, or in both the display region 100 and the bending region 200. In the present embodiment, the second metal oxide 151 is formed in both the display region 100 and the bending region 200, that is, the second metal oxide 151 is formed to be a layer and can be formed by natural oxidation or thermal oxidation.

So far, the flexible substrate 10 is prepared.

Figure 11:
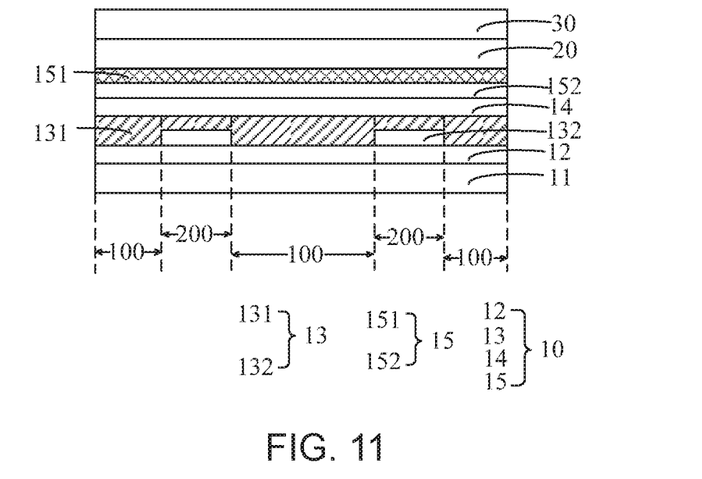
FIG. 11 is a schematic view showing a seventh step of a method of manufacturing a flexible display panel provided by an embodiment of the present disclosure.

Step 3: forming a driver circuit layer 20 and a luminescent functional layer 30 on a side of the flexible substrate 10 away from the substrate 11.

As shown in FIG. 11, the driver circuit layer 20 is formed on a side of the flexible substrate 10, and the luminescent functional layer 30 is formed on a side of the driver circuit layer 20 away from the flexible substrate 10. The driver circuit layer 20 includes a driver circuit that drives the luminescent functional layer 30 to emit light.

Figure 12:
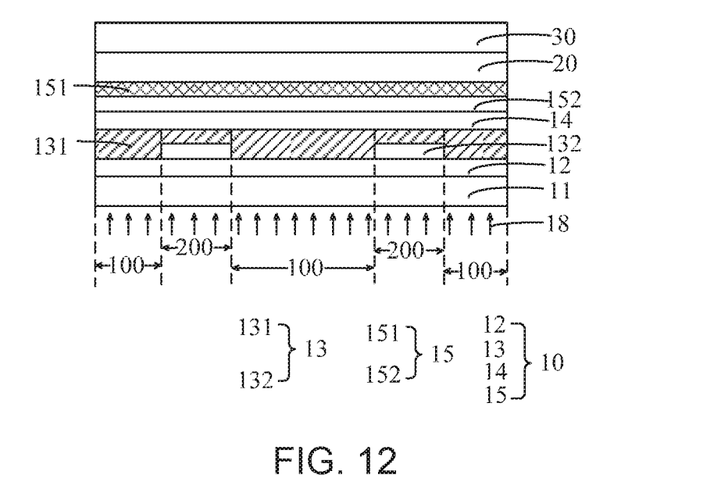
FIG. 12 is a schematic view showing an eighth step of a method of manufacturing a flexible display panel provided by an embodiment of the present disclosure.
Figure 13:
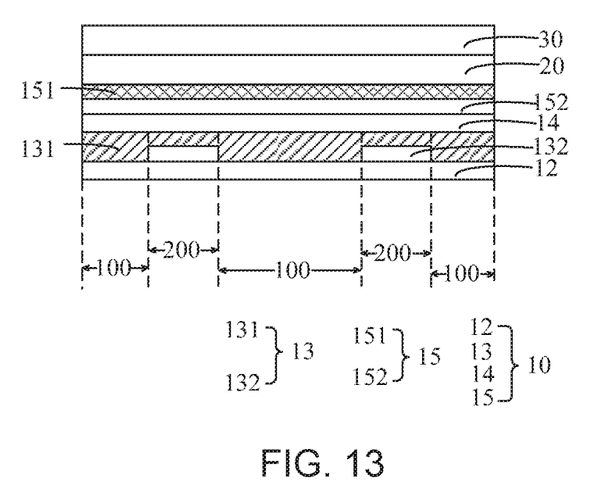
FIG. 13 is a schematic view showing a ninth step of a method of manufacturing a flexible display panel provided by an embodiment of the present disclosure.

Step 4: peeling off the substrate 11. As shown in FIG. 12, before the flexible display panel is formed, the substrate 11 needs to be peeled off from the flexible substrate 10 by laser or a glass machine. In the present embodiment, the substrate 11 is peeled off from the flexible substrate 10 by a laser 18. Finally, as shown in FIG. 13, the flexible display panel is formed.

In the present disclosure, Al with a certain thickness is deposited on a surface of PI, the Al in the display region 100 is fully oxidized to a dense aluminum oxide layer, and the Al in the bending region 200 is only partially oxidized to form a thin aluminum oxide layer, thereby forming PI/aluminum oxide composite films on a substrate. Therefore, exceptional properties of PI can be retained, moisture and oxygen blocking ability can be improved by a dense first metal oxide 131, and flexibility can be improved by the first metal 132 and a thin-film first metal oxide 131. As a result, problems such as stress concentration, easy breakage in the bending region, and easy separation in high temperature and high humidity environment which are caused by the PI/aluminum oxide composite films can be prevented. By the above method, flexibility of the flexible display panel is improved, which is beneficial to form a foldable and flexible display panel with double curved surfaces shown in FIG. 2.

According to the above embodiments, the present disclosure provides a flexible display panel and a manufacturing method thereof. The flexible display panel includes a display region and a bending region. The flexible display panel further includes a flexible substrate, a driver circuit layer, and a luminescent functional layer. The driver circuit layer is formed on a side of the flexible substrate. The luminescent functional layer is formed on the driver circuit layer away from the flexible substrate. The flexible substrate includes a first flexible layer, a first barrier layer, and a second flexible layer. The first barrier layer includes a metal oxide disposed in the display region and a stacked-layer including metal and the metal oxide disposed in the bending region. The entire metal in the display region is oxidized to form the metal display oxides and a portion of metal in the bending region is oxidized to form the metal oxides. In the display region, the metal oxides can block moisture and oxygen. In the bending region, the metals can improve flexibility of the display panel, and the metal oxides can improve adhesion of the second flexible layer, thereby improving stability in a bending state. The metal oxides in the display region and the metal oxides in the bending region can make the flexible display panel have good ability to block moisture and oxygen and good flexibility, which solves the technical problem that non-organic thin films of conventional flexible display panels reduce flexibility of a flexible substrate.

To sum up, the present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

What is claimed is:

1. A flexible display panel, comprising:
a display region; and
a bending region;
wherein the flexible display panel comprises a flexible substrate, a driver circuit layer disposed on a side of the flexible substrate, and a luminescent functional layer disposed on a side of the driver circuit layer away from the flexible substrate;
wherein the flexible substrate comprises a first flexible layer, a first barrier layer, and a second flexible layer;
the first barrier layer comprises a first metal oxide disposed in the display region and a stacked-layer comprising a first metal and the first metal oxide disposed in the bending region; and
a plurality of rows of the first metal oxide are arranged along a first direction in the bending region.

2. The flexible display panel of claim 1, wherein material of the first metal is Al.

3. The flexible display panel of claim 2, wherein in the bending region, an area of the first metal oxide is equal to an area of the bending region.

4. The flexible display panel of claim 2, wherein a plurality of arrays of the first metal oxide are distributed in the bending region.

5. The flexible display panel of claim 2, wherein in the bending region, a thickness of the first metal oxide is less than one quarter of a thickness of the first barrier layer.

6. The flexible display panel of claim 1, wherein the flexible substrate further comprises a second barrier layer formed on a side of the second flexible layer away from the first barrier layer, and the second barrier layer comprises a stacked-layer comprising a second metal and a second metal oxide.

7. The flexible display panel of claim 6, wherein the second metal oxide is formed in at least one of the bending region or the display region.

8. The flexible display panel of claim 6, wherein a thickness of the second metal oxide is equal to a thickness of the first metal oxide disposed in the bending region.

9. A method of manufacturing a flexible display panel, comprising the following steps:
providing a substrate;
forming a flexible substrate on a side of the substrate, wherein the flexible substrate comprises a first flexible layer, a first barrier layer, and a second flexible layer, and the first barrier layer comprises a first metal oxide disposed in a display region and a stacked-layer comprising a first metal and the first metal oxide disposed in a bending region;
patterning the first metal by oxidation process to oxidize the first metal to form the first metal oxide in the display region, and oxidizing the first metal in the bending region to form the stacked-layer comprising the first metal and the first metal oxide, wherein the stacked-layer is the first barrier layer;
forming a driver circuit layer and a luminescent functional layer on a side of the flexible substrate away from the substrate; and
peeling off the substrate.

10. The method of claim 9, wherein the step of forming the flexible substrate on the side of the substrate, wherein the flexible substrate comprises the first flexible layer, the first barrier layer, and the second flexible layer, and the first barrier layer comprises the first metal oxide disposed in the display region and the stacked-layer comprising the first metal and the first metal oxide disposed in the bending region, comprising the following steps:
depositing the first metal on the first flexible layer, wherein the first metal is disposed in the display region and the bending region.

11. The method of claim 10, wherein the step of depositing the first metal on the first flexible layer, wherein the first metal is disposed in the display region and the bending region, comprising the following step:
forming the first metal by physical vapor deposition.

12. The method of claim 10, wherein the step of depositing the first metal on the first flexible layer, wherein the first metal is disposed in the display region and the bending region, comprising the following step:
depositing Al on the first flexible layer.

13. The method of claim 10, wherein the step of patterning the first metal by oxidation process to oxidize the first metal to form the first metal oxide in the display region, and then oxidizing the first metal in the bending region to form the stacked-layer comprising the first metal and the first metal oxide, wherein the stacked-layer is the first barrier layer, comprising the following step:
patterning the first metal by oxidation process, and then forming the first metal oxide in the bending region, wherein an area of the first metal oxide in the bending region is equal to an area of the bending region.

14. The method of claim 10, wherein the step of patterning the first metal by oxidation process to oxidize the first metal to form the first metal oxide in the display region, and then oxidizing the first metal in the bending region to form the stacked-layer comprising the first metal and the first metal oxide,
wherein the stacked-layer is the first barrier layer, comprising the following step:
patterning the first metal by oxidation process to form a plurality of rows of the first metal oxide arranged along a first direction in the bending region.

15. The method of claim 10, wherein the step of patterning the first metal by oxidation process to oxidize the first metal to form the first metal oxide in the display region, and then oxidizing the first metal in the bending region to form the stacked-layer comprising the first metal and the first metal oxide, wherein the stacked-layer is the first barrier layer, comprising the following step:
patterning the first metal by oxidation process to form a plurality of arrays of the first metal oxide distributed in the bending region.

16. The method of claim 10, wherein the method of patterning the first metal by oxidation process to oxidize the first metal to form the first metal oxide in the display region, and then oxidizing the first metal in the bending region to form the stacked-layer comprising the first metal and the first metal oxide, wherein the stacked-layer is the first barrier layer, comprising the following step:
patterning the first metal by oxidation process to make a thickness of the first metal oxide formed in the bending region less than one quarter of a thickness of the first barrier layer.

17. The method of claim 9, wherein the step after forming the flexible substrate on the side of the substrate, wherein the flexible substrate comprises the first flexible layer, the first barrier layer, and the second flexible layer, and the first barrier layer comprises the first metal oxide disposed in the display region and the stacked-layer comprising the first metal and the first metal oxide disposed in the bending region, further comprising the following step:
forming a second barrier layer on a second flexible layer, wherein the second barrier layer comprises a stacked-layer comprising a second metal and a second metal oxide.

18. The method of claim 17, wherein the step of forming the second barrier layer on the second flexible layer, wherein the second barrier layer comprises the stacked-layer comprising the second metal and the second metal oxide, comprising the following step:
oxidizing the second metal in at least one of the bending region or the display region to form the stacked-layer comprising the second metal and the second metal oxide.

19. The method of claim 17, wherein the step of forming the second barrier layer on the second flexible layer, wherein the second barrier layer comprises the stacked-layer comprising the second metal and the second metal oxide, comprising the following step:
forming the second metal oxide by natural oxidation or thermal oxidation.

* * * * *